US012787671B2

(12) United States Patent
Koty et al.

(10) Patent No.: US 12,787,671 B2
(45) Date of Patent: Nov. 3, 2026

(54) HALOGEN GAS MIXTURES FOR THROUGH-SUBSTRATE ETCHING

(71) Applicants: Tokyo Electron Limited, Tokyo (JP); International Business Machines Corporation, Armonk, NY (US)

(72) Inventors: Devi Koty, Hopewell Junction, NY (US); Qingyun Yang, Hopewell Junction, NY (US); Nathan P. Marchack, New York, NY (US)

(73) Assignees: Tokyo Electron Limited, Tokyo (JP); International Business Machines Corporation, Armonk, NY (US)

( * ) Notice: Subject to any disclaimer, the term of this patent is extended or adjusted under 35 U.S.C. 154(b) by 232 days.

(21) Appl. No.: 18/591,823

(22) Filed: Feb. 29, 2024

(65) Prior Publication Data

US 2025/0279281 A1 Sep. 4, 2025

(51) Int. Cl.

| | |
|---|---|
| ***H10P 50/24*** | (2026.01) |
| ***H10P 50/00*** | (2026.01) |
| ***H10P 50/26*** | (2026.01) |
| ***H10P 50/28*** | (2026.01) |
| ***H10P 72/00*** | (2026.01) |
| ***H10W 20/00*** | (2026.01) |
| ***H10W 20/20*** | (2026.01) |

(52) U.S. Cl.

CPC .......... *H10P 50/242* (2026.01); *H10P 50/244* (2026.01); *H10P 50/267* (2026.01); *H10P 50/283* (2026.01); *H10P 50/73* (2026.01); *H10P 72/0421* (2026.01); *H10W 20/023* (2026.01); *H10W 20/20* (2026.01)

(58) Field of Classification Search

None

See application file for complete search history.

(56) References Cited

U.S. PATENT DOCUMENTS

2014/0363975 A1* 12/2014 Wei ..................... B81C 1/00619 156/345.24

2015/0126033 A1* 5/2015 LeFevre ............ H01J 37/32091 438/694

FOREIGN PATENT DOCUMENTS

EP 2808735 * 3/2014 ............. G03F 7/004

WO WO2023069410 * 4/2023 ......... H01L 21/3065

OTHER PUBLICATIONS

G.K. Lau et al., “Ultra-High Selectivity TSV Etching Hardmask Process Development and Integration for 3D-SIC”, 13th Electronics Packaging Technology Conference, pp. 345-348. (Year: 2011).*

(Continued)

*Primary Examiner* — Jiong-Ping Lu

(74) *Attorney, Agent, or Firm* — Slater Matsil, LLP

(57) ABSTRACT

A semiconductor substrate can be loaded into a plasma chamber, the semiconductor substrate having a through opening within a mask layer disposed over the semiconductor substrate. Using a plasma process, a through substrate via can be formed within the semiconductor substrate. The through substrate via can have a circular shape or an annulus shape with an inner semiconductor core. The plasma process can include exposing the through opening to a plasma chemistry formed from a gas mixture comprising boron, chlorine, fluorine, carbon, and sulfur.

20 Claims, 7 Drawing Sheets

(56) References Cited

OTHER PUBLICATIONS

J. Wang et al., "A Short Review of Through-Silicon via (TSV) Interconnects: Metrology and Analysis", Applied Science, 2023, 13, 8301 (Year: 2023).*

Dobkin, D., "Comparing low frequency (100 kHz) plasma systems to higher frequency (13.56 MHz) plasma systems," Glow Research, https://www.glowresearch.org/plasma-applications/comparing-low-frequency-100-khz-plasma-systems-to-higher-frequency-13-56-mhz-plasma-systems/, Nov. 9, 2018, 15 pages.

Gambino et al., "An overview of through-silicon-via technology and manufacturing challenges," Microelectronic Engineering 135, Jan. 8, 2015, pp. 73-106, 34 pages total.

Jansen et al., "Black silicon method: X. A review on high speed and selective plasma etching of silicon with profile control: an in-depth comparison between Bosch and cryostat DRIE processes as a roadmap to next generation equipment," Journal of Micromechanics and Microengineering, vol. 19, Feb. 2, 2009, doi:10.1088/0960-1317/19/3/033001, 43 pages.

Ouyang et al., "Etching mechanism of the single-step through-silicon-via dry etch using SF6/C4F8 chemistry," Journal of Vacuum Science & Technology A vol. 32 No. 4, Jul./Aug. 2014; doi: 10.1116/1.4885500, 11 pages.

Slabbekoorn et al., "Bosch Process Characterization for Donut TSV's," IWLPC, International Wafer-Level Packaging Conference, Nov. 2014, San Jose, CA, Surface Mount Technology Association (SMTA). 6 pages.

* cited by examiner

HALOGEN GAS MIXTURES FOR THROUGH-SUBSTRATE ETCHING

TECHNICAL FIELD

The present disclosure relates generally to semiconductor fabrication, and, in particular implementations, to using halogen gas mixtures for through-substrate etching.

BACKGROUND

Generally, a semiconductor integrated circuit (IC) is fabricated by sequentially depositing a dielectric, conductive, or semiconductor layer over a semiconductor substrate and patterning the layer using photolithography and etch to form electronic and interconnect elements like transistors, resistors, capacitors, metal lines, contacts, and vias in one monolithic structure. At each new technology node, feature sizes are reduced, resulting in increasing the packing density of IC elements to reduce cost. As packing density increases and feature sizes decrease, the ongoing advancement in semiconductor device technology can be constrained by physical limits as compared to prior progress.

Therefore, for further development, the semiconductor industry has embraced three-dimensional (3D) packaging (or 3D integration, hybrid bonding, etc.), such as by stacking multiple semiconductor substrates together using various methods. 3D packaging brings both technological and economic advantages, such as by enabling a mixture of technology nodes to be used in a single final product.

A key aspect in 3D packaging is the ability to form through-substrate openings that are transformed into metallized interconnects for conductive pathways of electrical connections between stacked or bonded semiconductor dies. Such substrate openings, which can include a hole that partially or completely penetrates a substrate, also called a via, can be formed from either side of a die, such as for signal connections and power connections, which may be located on separate sides of a die. One type of high-aspect ratio opening used for 3D packaging is a through substrate via (TSVs, also referred to as a through silicon via) that penetrate the semiconductor substrate and thereby enable short and effective interconnections between stacked dies.

One factor limiting high aspect ratio semiconductor structures can be the use of certain etch processes and etchant chemistries that are used for aggressive deep etches, such as TSVs. Some etch processes and etchant chemistries can result in poor etch quality as well as low etch rates, which are undesirable.

SUMMARY

In one aspect, a first method of forming a through substrate via is disclosed. The first method includes forming a mask layer over a semiconductor substrate, creating an opening through the mask layer to expose a surface portion of the semiconductor substrate, and flowing a chlorine-containing gas, a fluorocarbon gas, and a sulfur-containing halogen gas into a plasma chamber loaded with the semiconductor substrate. The first method can also include generating a plasma from a gas chemistry including the chlorine-containing gas, the fluorocarbon gas, and the sulfur-containing halogen gas, and, while flowing the gas chemistry into the plasma chamber, directing the plasma to the opening to extend the opening through the semiconductor substrate to form the through substrate via.

In another aspect, a second method of forming through-substrate vias is disclosed. The second method includes loading a semiconductor substrate into a plasma chamber, forming a plurality of through-openings within a mask layer disposed over the semiconductor substrate, and flowing a gas chemistry including a boron-containing gas, a fluorocarbon gas, and a sulfur-containing halogen gas into the plasma chamber. The second method can also include applying first electrical power to first electrodes of the plasma chamber to generate a plasma from the gas chemistry flowing into the plasma chamber, and, while flowing the gas chemistry into the plasma chamber, subjecting the through-openings to the plasma to extend the through-openings into the semiconductor substrate to form the through-substrate vias.

In yet a further aspect, a third method of forming through substrate vias is disclosed. The third method includes loading a semiconductor substrate into a plasma chamber, the semiconductor substrate including a through-opening within a mask layer disposed over the semiconductor substrate, and forming, using a plasma process, a through-substrate via within the semiconductor substrate, the through-substrate via including an annulus shape with an inner semiconductor core, the plasma process including exposing the through-opening to a plasma chemistry formed from a gas mixture including boron, chlorine, fluorine, carbon, and sulfur.

BRIEF DESCRIPTION OF THE DRAWINGS

For a more complete understanding of the present disclosure, and the advantages thereof, reference is now made to the following descriptions taken in conjunction with the accompanying drawings, in which.

DETAILED DESCRIPTION OF ILLUSTRATIVE IMPLEMENTATIONS

Figure 1:
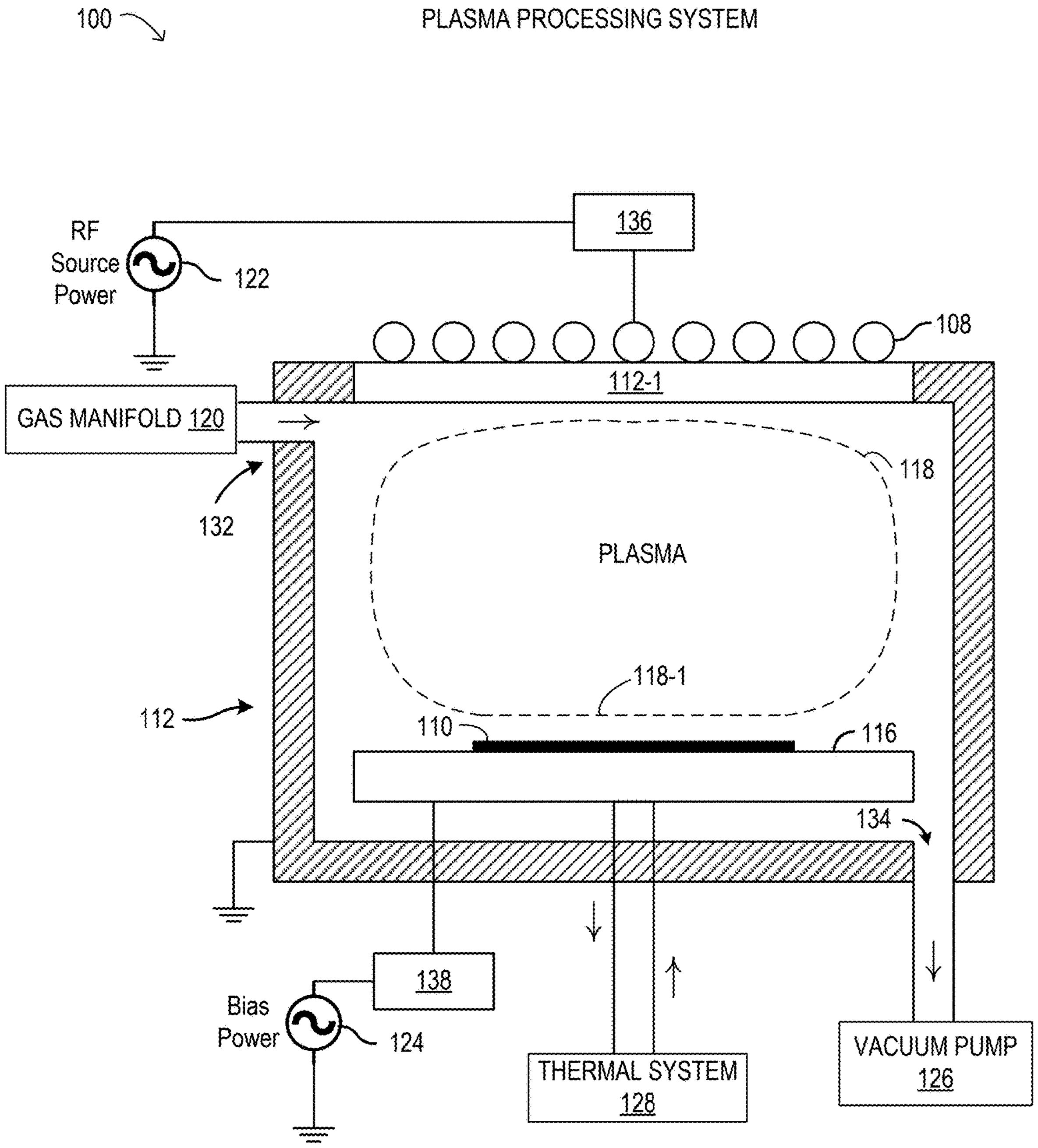
FIG. 1 is a depiction of a plasma processing system in one implementation.

This disclosure describes using various halogen gas mixtures during through-substrate etching of a semiconductor substrate in various implementations.

In the following description, details are set forth by way of example to facilitate discussion of the disclosed subject matter. It should be apparent to a person of ordinary skill in the field, however, that the disclosed implementations are exemplary and not exhaustive of all possible implementations.

Throughout this disclosure, a hyphenated form of a reference numeral refers to a specific instance of an element and the un-hyphenated form of the reference numeral refers to the element generically or collectively. Thus, as an example (not shown in the drawings), device "12-1" refers to an instance of a device class, which may be referred to collectively as devices "12" and any one of which may be referred to generically as a device "12". In the figures and the description, like numerals are intended to represent like elements.

As used herein, the terms "via", "hole", "opening", and "void" may be used interchangeably to generally describe a void that penetrates into a substrate. In particular, a via is referred to as a hole that penetrates an XY circuit plane to provide interconnections to another XY circuit plane at a different Z elevation. Vias can have various geometric cross sectional shapes and various dimensions in different implementations.

As noted above, the semiconductor industry has embraced 3D packaging to enable hybrid devices, such as that stack bonded dies together and mix different technology nodes in a single final product for economic benefits. The interconnects between bonded semiconductor dies, for example, can be formed using through-substrate openings that are used for electrical connections between specific locations of the stacked or bonded semiconductor dies. Such substrate openings are holes that can partially or completely penetrate a given substrate layer, and may be referred to as vias with respect to a penetrated layer. One type of high-aspect ratio opening used for 3D packaging are TSVs that penetrate through the semiconductor substrate and thereby provide short and effective interconnections between stacked and bonded dies. TSV technology is a promising technology in 3D packaging that can provide interconnections between stacked ICs, potentially increasing performance, while reducing signal delay and power consumption.

In some implementations, metallized contact layers can be formed on either side of a die, such as for signal connections and power connections, which may be located on separate sides of a die. Thus, such through-substrate openings can partially or completely penetrate a die substrate and can be used for signal connections or power connections or both. Besides various types of bonded substrates, such as wafers and die, other applications of TSVs and other high aspect ratio structures formed in semiconductor substrates include microelectro mechanical systems (MEMS), high-density trench capacitors, such as for dynamic random access memory (DRAM), and for plasma dicing of wafers to produce individual die, among other applications.

Various different types of methods may be used to form substrate openings, including deep reactive ion etching (DRIE). TSVs are typically high aspect ratio structures that test the limits of current etching technologies used for such interconnects. In DRIE corrosive etch gases along with an ionized plasma are used for aggressive deep etches, such as for forming TSVs, in an anisotropic manner. Various types of etching processes can be generally categorized as isotropic or anisotropic (or directional).

Isotropic etching refers to etch processes that lack directionality in the removal of material. Because isotropic etching removes exposed material without regard to directionality, isotropic etching is associated with a certain degree of lateral material removal at the surface of a semiconductor substrate, along with vertical material removal. Therefore isotropic etching is more suited for uniform or quasi-uniform removal of surface layers, as well as for certain low aspect ratio vertical openings, typically less than about 10:1 (e.g., depth:opening size) or smaller, at the surface of a semiconductor substrate. Because TSVs and other high aspect ratio vertical openings generally have aspect ratios greater than about 10:1, isotropic etching may not be a particularly suitable technique for forming such high aspect ratio vertical openings in a semiconductor substrate, even when higher energy etching methods such as isotropic plasma etching is used.

Instead, anisotropic etching is used to form high aspect ratio vertical openings that provides directionality in the material removal mechanism. Therefore, anisotropic etching will be discussed in further detail herein for forming TSVs and other vertical openings in a semiconductor substrate. The use of plasma-assisted ion-enhanced etching techniques, such as DRIE, are particularly well suited for anisotropic etching and are accordingly widely used in the semiconductor industry. TSVs with diameters in the micrometer range may be mainly fabricated using DRIE technology (see FIGS. 1, 2A, 2B). In the following discussion, reference is made to TSVs, or vias in general, as high-aspect ratio openings that can be formed in a semiconductor substrate using DRIE or other anisotropic etching techniques. However, it is noted that other high aspect ratio vertical structures (e.g., trenches, notches, steps, etc.) can also be formed in the same or similar manner as described herein with respect to TSVs, or more generally, to vias.

In DRIE, certain neutral molecules as well as plasma-excited species, including free radicals and ions, may be directed to the semiconductor substrate surface to remove substrate material as a result of chemical reactions with the substrate material, while volatile byproducts of the chemical reactions are removed. Typically, a mask layer is formed on the semiconductor substrate surface and is patterned with openings where the one or more TSVs are desired, such as specified by a particular mask pattern associated with a given layer of a semiconductor device. The opening exposes a surface portion of the semiconductor substrate where vertical material removal to form a via, such as a TSV, through the substrate is desired. A material used for the mask layer can have a desirably low selectivity for removal by the particular etch process and corresponding etch chemistry used, as compared with the semiconductor substrate. Accordingly, a mask selectivity ratio can be defined as a ratio of a first rate of material removal of the substrate to a second rate of material removal of the mask, where higher mask selectivity ratios indicate better mask performance in a given etch process for the purpose of substrate material removal.

As noted, anisotropic etching is a preferred technique for forming high aspect ratio vias, such as TSVs. However, the mere depth of the via formed does not reflect all the desired attributes of a successful high aspect ratio via in semiconductor fabrication. In addition to depth, a uniform cross-section or shape of the via is also desired, which as noted, can be undermined by even a small degree of isotropic lateral etching that is undesirable. The desired uniform cross-section or shape of a via can be manifested or described, in one instance, as a low degree of edge roughness of a vertical sidewall of the via. Thus, ion-assisted (or ion-enhanced) anisotropic etching is preferred to minimize isotropic lateral etching, such as to promote the establishment of 'clean' vertical sidewalls having low edge roughness at patterned via locations. Besides variability or edge roughness of the vertical sidewalls of a via, various plasma etching techniques, including DRIE, may exhibit certain other non-uniformities of cross-section or shape of the via, such as bowing and microtrenching, among others. Bowing refers to a slight degree of lateral etching along the etch path that can result in a rounded sidewall profile, instead of a straight vertical sidewall profile, with the rounding typically being concave with respect to the via. Microtrenching refers to somewhat sharp increases in etch depth at the bottom corners of the via, such that a bottom surface of the via becomes convex with respect to the via. Microtrenching can result from low-angle scattering of ions off the sidewalls that focuses ion energy at the bottom corners of the via, causing increased substrate material removal at the bottom corners, which is undesirable.

In order to adequately control or minimize such nonuniform etch anomalies, among others, a special kind of anisotropic plasma etching technique called ion-enhanced inhibitor etching is used, such as with DRIE processes. In ion-enhanced inhibitor etching, an inhibitor species (also referred to as a passivating agent, a passivator for passivation of sidewalls) can be continuously formed at the exposed surfaces of the via during the etch process, such as by forming an inhibitor layer at the inner surfaces of the via (see also FIG. 7). As described in further detail herein, the inhibitor chemistry may depend on the gas chemistry introduced in the etch process for excitation of the plasma. Because ion-enhanced inhibitor etching is used in an anisotropic manner, the reactive etching ions are directed to continuously remove the inhibitor layer at the bottom of the via where further etching is desired, but do not remove the inhibitor layer formed on the vertical sidewalls of the via. Thus, particularly for high aspect ratio vias, such as TSVs, ion-enhanced inhibitor etching is often used.

One widely used anisotropic plasma etch process that employs ion-enhanced inhibitor etching is a so-called Bosch etch process, in which two different process steps (or process conditions) are alternated in situ during etching. In particular, the Bosch etch process may be used for high-aspect ratio structures, such as TSVs. A first step in the Bosch process involves DRIE to remove substrate material using a first gas chemistry using etching gases and may last for a first duration. Then, in alternation of the process conditions, the first gas chemistry having the etching gases is removed while DRIE is suspended, and a second gas chemistry having a passivating agent is introduced for a second step in the Bosch process. In the second step, the passivating agent results in passivation by depositing a chemically inert passivation layer at the exposed surface, which lasts for a second duration. In this manner, in the Bosch process, the gas chemistry in the etch environment is rapidly alternated in situ between the first gas chemistry and the second gas chemistry.

In particular for silicon substrates, the Bosch process may involve a plasma etch cycle using the first gas chemistry containing sulfur hexafluoride ($SF_6$) for DRIE through silicon for the first step. For the second passivation step, the second gas chemistry is used for passivation by depositing a chemically inert passivation layer, such as by using octafluorocyclobutane ($C_4F_8$), which may provide a polymerized passivation layer. The etch and passivation cycle steps may be alternated after several seconds by switching of the gas environment back and forth between etch gas and deposition gas. During the Bosch process, the passivation layer prevents lateral etching of the substrate while the etching progresses vertically into the substrate at the bottom of the via.

Although the Bosch process is used for high aspect ratio patterning, such as TSVs, among other deep vertical structures, that can reach aspect ratios of 60:1 or greater, certain imperfections or defects may be associated with the alternating gas environment, which may be undesirable. An ideal via profile is typically one with parallel or straight edge profiles of the remaining material in the high aspect ratio structure, such as a TSV. In some cases, adverse outcomes in the profile of deep etched structures using the Bosch process can result, which is undesirable.

In one example of an adverse outcome in the Bosch process, a profile of the high-aspect ratio structure formed using the Bosch etch process can have a tapered shape that reduces in diameter or cross-sectional area along the etch path. The tapered shape resulting from the Bosch process may arise when the passivating layers are deposited in excess, thereby reducing or constraining the amount of desired material to be removed by etching. In this case the desired aspect ratio or etch depth may not be attained due to the tapered profile, which can be an undesired outcome. In another example of an adverse outcome in the Bosch process, mask undercutting may occur at the Si-mask interface during etching. In such cases of mask undercutting, the Si-mask interface is not properly passivated, whether from increased etching at the Si-mask interface or due to poor formation of the passivating layers, which are undesirable outcomes. In yet another example of an adverse outcome in the Bosch process, a reversed tapered profile may result that increases in diameter or cross-sectional area along the etch path. The reversed tapered shape from the Bosch process may occur when the passivating layers are insufficiently deposited such that too much material is etched away along the etch path. In such cases of reversed tapered profiles, the insufficient deposition of passivating layers may become worse as the aspect ratio increases, to longer depths along the etch path, in particular implementations. When process controls during Bosch or other etch processes are insufficiently regulated in a tight window, the amount of passivation layer that is deposited may vary or secondary effects may occur that result in bowing of the etch profile in which the diameter or cross-sectional area of the etched structure varies, both positively and negatively, to an undesirable extent. Another example of undesirable outcomes from the Bosch process include scalloping that can occur as a result of in situ alternation of the etch gas and the passivation gas, even when the Bosch process parameters are otherwise optimized, and results in an undesired high edge roughness of the etch profile. In particular, scalloping involving a periodic edge roughness corresponding to the two step cycle rates, among other adverse outcomes in the Bosch process, can be problematic for TSVs when a subsequent metallization, e.g., with copper (Cu), is performed to fill the TSV, such as to form a through substrate conductor trace. The scalloping, among other nonuniformities mentioned above, in the TSV sidewalls may geometrically disrupt the subsequent metallization process and can negatively impact the electrical properties of the through substrate conductor trace formed, such as by causing voids or cracks or undesired roughness in the metal deposited in the TSV.

In order to avoid certain undesirable aspects associated with the Bosch process, continuous etch processes are also used and continue to be developed and refined. As described herein in further detail, continuous etch processes can involve an etch gas chemistry to which the semiconductor substrate is exposed during etching. Such continuous etch processes (also referred to as non-Bosch processes) may use similar etch gas chemistry as used for the etch cycle in the Bosch process, such as $SF_6$ for silicon-semiconductor materials. Certain continuous non-Bosch processes for etching silicon substrates have used DRIE processes with $SF_6$ gas chemistry, such as with the addition of a fluorocarbon passivating agent. Typical continuous non-Bosch etch processes may be effective for many applications where lower aspect ratio structures are to be fabricated, such as aspect ratios of about 10:1 or lower.

However, for high aspect ratio structures, such as TSVs in silicon substrates, typical non-Bosch continuous etch processes may be associated with certain adverse results that have constrained the use of the non-Bosch processes in such applications. The use of continuous non-Bosch etch processes for deep, high-aspect ratio structures, such as TSVs in silicon substrates using $SF_6$ etch gas chemistry with fluorocarbon passivating agents, has been observed to cause sidewall damage in the silicon substrate, and has also exhibited a relatively low etch rate with low mask selectivity, which are undesirable aspects. The sidewall damage observed has involved a higher degree of sidewall roughness along with a bowed sidewall profile in the remaining silicon substrate, which can adversely affect a subsequent metallization of the via formed, as noted above. The relatively low etch rate and low mask selectivity observed in such typical non-Bosch etch processes for deep silicon etches have been more disadvantageous and less desirable than observed for similar conventional Bosch processes that can have higher etch rates and higher mask selectivity, but which result in scalloping and other anomalies that also remain undesirable for subsequent metallization, as mentioned above.

As will be described in further detail herein, halogen gas mixtures for through-substrate etching using a non-Bosch process have been shown to provide certain advantages over Bosch etch processes and over typical non-Bosch etch processes. Certain implementations provide for high aspect ratio structure etching using non-Bosch processes with halogen gas mixtures that exhibit smooth sidewalls in silicon substrates. Certain implementations provide for high aspect ratio structure etching using non-Bosch processes with halogen gas mixtures that have high etch rates in silicon substrates. Certain implementations provide for high aspect ratio structure etching using non-Bosch processes with halogen gas mixtures that show high mask selectivity in silicon substrates. Certain implementations provide for high aspect ratio structure etching using non-Bosch processes with halogen gas mixtures including a chlorine-containing gas, a fluorocarbon gas, and a sulfur-containing halogen gas for etching silicon substrates. Certain implementations provide for high aspect ratio structure etching using non-Bosch processes with halogen gas mixtures including a boron-containing gas, a fluorocarbon gas, and a sulfur-containing halogen gas for etching silicon substrates. Certain implementations provide for high aspect ratio structure etching using non-Bosch processes with halogen gas mixtures including boron, chlorine, fluorine, carbon, and sulfur for etching silicon substrates.

Turning now to the drawings, FIG. 1 is a depiction of a plasma processing system 100 in one implementation. FIG. 1 is a schematic depiction and is not necessarily drawn to scale or perspective. Plasma processing system 100, as shown, is indicative of various specific implementations and is not limited to any particular design or specific process equipment. Accordingly, in various implementations, plasma processing system 100 may include more or fewer elements than depicted in FIG. 1.

As shown in FIG. 1, plasma processing system 100 includes a process chamber 112 that can be pumped down to a desired vacuum pressure, such as by using a vacuum pump 126 in fluid communication with process chamber 112 via a gas outlet 134. Vacuum pump 126 can be a turbo molecular pump in some implementations, among other types of pumps. Process chamber 112 is configured to load a semiconductor substrate 110 (or simply substrate 110), such as a silicon wafer on which multiple circuit designs in the form of multiple IC die can be fabricated, among other types and materials of substrates. In particular implementations, semiconductor substrate 110 may be 300 mm in diameter, among other sizes. Semiconductor substrate 110 may accordingly be used in process chamber 112 at various stages of fabrication.

As shown in FIG. 1, semiconductor substrate 110 is supported by a chuck 116 that can retain and secure semiconductor substrate 110 in a desired aligned position with respect to chuck 116. In various implementations, chuck may comprise an electrostatic chuck configured to hold a backside of substrate 110, while a frontside of substrate 110 opposite the backside can be exposed to a plasma 118 inside plasma chamber 112. Chuck 116 can also be capable of loading and unloading semiconductor substrate 110 from process chamber 112, such as with the cooperation of other equipment, such as handling robots or equipment. Chuck 116 can be mounted within process chamber 112 in a manner that enables raising or lowering of semiconductor substrate 110 with respect to a plasma front 118-1 of plasma 118 generated within process chamber 112. Specifically, after an interior volume of process chamber 112 is pumped down to a sufficient vacuum pressure, such as a sufficiently low vacuum pressure, a gas manifold 120 can meter and deliver a gas mixture in fluid communication with process chamber 112. Gas manifold 120 may include gas canisters, throttle valves, flow meters, pressure sensors, among other components, to maintain a controlled gas flow in plasma chamber 112.

In FIG. 1, gas manifold 120 can be configured to mix or provide any number of source gases to process chamber 112 and can further change a composition or a flow rate associated with the gas mixture so provided, for example to independently control a supply of a constituent gas in the gas mixture, at a desired time, such as in response to an instruction from process control equipment that controls plasma processing system 100. An inlet 132 for the gas mixture so provided by gas manifold 120 is shown in fluid communication with process chamber 112. The gas mixture introduced into plasma chamber 112 is ionized by RF source power 122 to generate a plasma 118 over substrate 110, such as at plasma front 118-1 in proximity to substrate 110. As shown, plasma 118 is a glow discharge, ignited and sustained using electromagnetic (EM) power from a radio frequency (RF) source power 122 coupled to a first electrode 108 that is configured to generate EM fields inside plasma chamber 112. In some implementations, plasma processing system 100 can be configured in an inductively coupled plasma (ICP) mode, where RF source power 122 is coupled inductively to the gas mixture to generate plasma 118. In some implementations, RF source power 122 can be used in a capacitively coupled plasma (CCP) mode. Accordingly, first electrode 108 is shaped as a planar coil disposed over a top portion of the plasma chamber 112, indicated as a dielectric window 112-1. A first impedance matching circuit 136 in the signal path between RF source power 122 and first electrode 108 can suppress reflections to improve RF power transfer efficiency to plasma 118. As illustrated schematically in FIG. 3, a bias power 124 is coupled, via a second impedance matching circuit 138, to a second electrode, which can be a conductive structure that is located in proximity to chuck 116 and substrate 110. In the configuration shown in plasma processing system 100, first electrode 108 can couple RF source power 122 and the second electrode can couple bias power 124 to plasma 118. In some implementations, bias power 124 supplied to the second electrode may comprise EM power from a pulsed DC source. In plasma processing system 100, the two independent EM power sources (122, 124) coupled to plasma 118 can provide respective independent control over a plasma chemistry (e.g., various radicals and ions created from the gas mixture by RF source power 122) of plasma 118 and a directed kinetic energy of ions to the substrate 110 (e.g., by bias power 124), which controls anisotropy of the plasma etch process. Plasma 118 may accordingly include molecules, free radicals, excited radicals, ions, and electrons.

In plasma processing system 100, an extent to which the gas mixture from gas manifold 120 is excited to plasma 118 can depend on electrical power supplied by RF source power 122 that accordingly can control a gas chemistry of plasma 118 in this manner. As plasma 118 forms, a dark region or sheath surrounds plasma 118 and results in an electric field between plasma 118 and process chamber 112 that serves to contain plasma 118. Plasma 118 may extend towards semiconductor substrate 110 at plasma front 118-1 from which high energy radicals and ions can bombard semiconductor substrate 110. Specifically, a bias power 124 is electrically coupled to process chamber 112 and to semiconductor substrate 110 via chuck 116 (or another electrical connection) to provide an electrical bias to semiconductor substrate 110 for the purpose of regulating an ion energy of the ions bombarding semiconductor substrate 110 from plasma front 118-1, such as to influence a maximum ion bombardment energy during DRIE. Because RF source power 122 and bias power 124 can be biased to the same ground potential or reference potential (such as process chamber 112), bias power 124 provides electrical energy to directionally accelerate the ions from plasma front 118-1 in a direction perpendicular to the surface of semiconductor substrate 110, while other radicals and excited species also directionally bombard the surface of semiconductor substrate 110. Furthermore, it is noted that RF source power 122 and bias power 124 can be adjusted independently of each other to provide flexible control of DRIE gas chemistry and ion energy, respectively. As noted, a proximity of semiconductor substrate 110 to plasma front 118-1 can also be used for control of DRIE, such as by raising or lowering chuck 116. For example, bias power 124 can supply pulsed power, such as at a lower frequency than RF source power 122, to control a kinetic energy of ions at plasma front 118-1, for example to regulate DRIE reactions or to favor certain etch reactions or to suppress certain etch reactions. In some implementations, DRIE reactions can be controlled to favor more etch resistant passivating film for smooth sidewalls of the etched via, for example by favoring gas phase reactions that form carbon-based passivating films on the sidewalls, such as reactions involving chlorine (Cl), boron (B), sulfur (S), or fluorine (F) (see also passivating layer 706, FIG. 7). In some cases, the carbon-based passivating films on the sidewalls can be more etch resistant to fluorine radicals and erosion from ion bombardment, such as when radical concentrations in the plasma are increased to increase the etching rate. As a result of the controls and arrangement of elements in plasma processing system 100 shown in FIG. 1, anisotropic plasma etching in the form of DRIE using the gas mixture from gas manifold 120 can be performed in process chamber 112 on semiconductor substrate 110.

Chemical reactions being sensitive to temperature that can increase in substrate 110 during DRIE, plasma processing system 100 is equipped with a thermal system 128 configured to maintain substrate 110 at a desired temperature, such as by regulating cooling and/or heating of substrate 110. Accordingly, thermal system 128 may comprise liquid coolant, cooling gas, pumps, heater elements, power supplies, and temperature sensors, among other equipment for regulating cooling and/or heating. In particular implementations, chuck 116 can be mounted on a pedestal having a platen supported by a stem, while thermal system 128 may be configured with conduits or gas flow lines for accessing the platen through the stem of the pedestal on which chuck 116 is mounted, such as in order to circulate a coolant (e.g., He or L $N_2$) within the pedestal and flow the coolant through grooves in the platen in proximity to the backside of substrate 110. In particular implementations, electrical heating elements may be located within the pedestal proximate the backside of substrate 110 and controlled by electrical power supplied by thermal system 128.

As shown included with plasma processing system 100 in FIG. 1 thermal system 128 can supply a backside of substrate 110 with circulating coolant. A helium (He) coolant can be used to regulate a temperature of semiconductor substrate 110 during DRIE, which imparts thermal energy to semiconductor substrate 110, such as between about 0 C and 20 C in various implementations, among other ranges. A liquid nitrogen (L $N_2$) coolant can also be circulated, in addition to or instead of He coolant in different implementations, to provide regulated cryogenic cooling, such as down to about −100 C, or a lower temperature, for semiconductor substrate 110, such as when more precise or slower DRIE etch rates are desired, among other applications. It is noted that thermal system 128 can include various temperature sensors and instrumentation for measuring temperatures associated with a heating/cooling circulation loop for chuck 116 and semiconductor substrate 110, and can also receive temperature signals and values, such as provided for process chamber 112, in different implementations. Furthermore, during DRIE, vacuum pump 126 can evacuate volatile byproducts of the etch process, and can so regulate a desired pressure within process chamber 112. It is noted that other process controls and equipment can be used in different implementations of plasma processing system 100, such as vacuum pumps, temperature controls, heaters, coolers, gas filters, handling equipment, associated process chambers, among other equipment.

Accordingly, in particular implementations of DRIE performed on a silicon substrate using plasma processing system 100, the following process parameters given in Table 1 can be used, such as for a continuous non-Bosch DRIE process for semiconductor substrate 110 that comprises silicon (Si), in which the units used are Watts [W], Hertz [Hz], percent [%], millitorr [mTorr], standard cubic centimeter per minute [SCCM], degrees Celsius [C], and minutes [min].

TABLE 1

Process parameters for plasma processing system 100 for non-Bosch DRIE of a silicon substrate.

| Parameter Description | Process Parameter [Units] | Value Range |
|---|---|---|
| RF source power 122 -- Electrical Power | HF Power [W] | 500 to 3,000 |
| Bias power 124 - Electrical | High LF Power [W] | 40 to 120 |
| Pulse Power | Low LF Power [W] | 0 to 30 |
| Bias power 124 - Electrical Pulse Frequency | LF Pulse Rate [Hz] | 100 to 10,000 |
| Bias power 124 - Electrical Pulse Width | LF Duty Cycle [%] | 25 to 75 |
| Vacuum pump 126 Pressure | Chamber Pressure [mTorr] | 10 to 200 |
| Gas manifold 120 sulfur-containing halogen gas1 | Flow Rate 1 [SCCM] | 50 to 400 |
| fluorocarbon gas2 | Flow Rate 2 [SCCM] | 25 to 500 |
| inert carrier gas3 | Flow Rate 3 [SCCM] | 20 to 150 |

TABLE 1-continued

Process parameters for plasma processing system 100 for non-Bosch DRIE of a silicon substrate.

| Parameter Description | Process Parameter [Units] | Value Range |
|---|---|---|
| Chuck 116, thermal system 128 Temperature | Temperature [C.] | −20 to +30 |
| DRIE Etch Duration | Time [min] | 5 to 70 |

As will be described in further detail below, various halogen gas mixtures can be used with plasma processing system 100, such as in particular with a continuous non-Bosch process. For example, a first gas chemistry comprising a chlorine-containing gas, the fluorocarbon gas, and the sulfur-containing halogen gas can be used for DRIE. In the first gas chemistry, the chlorine-containing gas can further comprise boron, such as boron trichloride ($BCl_3$), such as at a flow rate within a range of 25 to 150 SCCM. In another example, a second gas chemistry comprising a boron-containing gas, the fluorocarbon gas, and the sulfur-containing halogen gas can be used for DRIE. In the second gas chemistry, the boron-containing gas can further comprise chlorine, such as boron trichloride ($BCl_3$). In a further example, a third gas chemistry comprising boron, chlorine, fluorine, carbon, and sulfur can be used for DRIE. In various implementations, other boron-containing gases can be used for DRIE, such as boron trifluoride ($BF_3$) and boron tribromide ($BBr_3$).

Figure 2A:
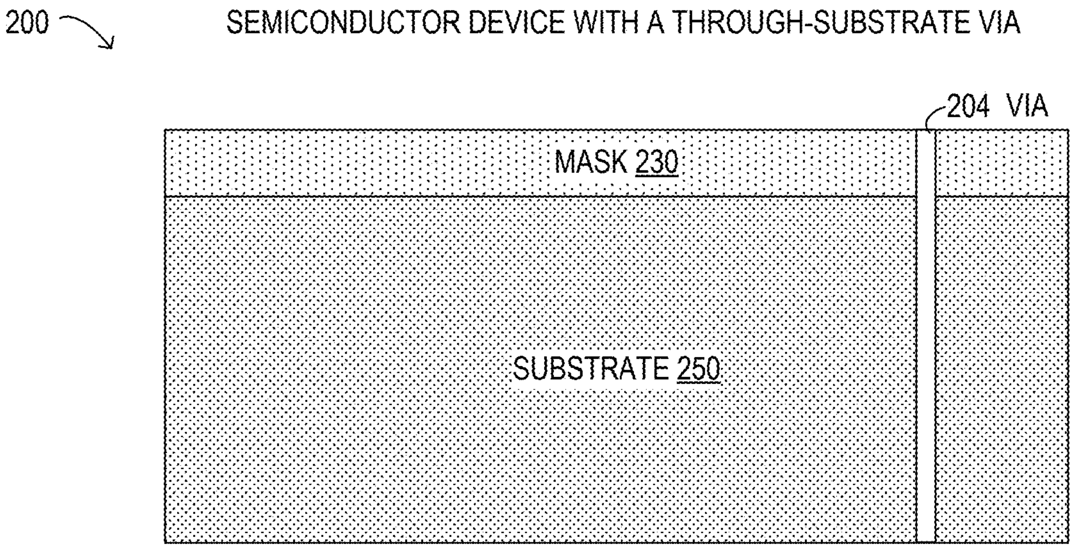
FIG. 2A is a depiction of a semiconductor device with a through-substrate via in one implementation.

FIG. 2A shows a depiction of a semiconductor device 200 with a through-substrate via 204 in one implementation. FIG. 2A is a schematic illustration and is not necessarily drawn to scale or perspective. FIG. 2A illustrates a result of a process for forming through-substrate vias using a DRIE process, such as described above using plasma processing system 100 with respect to FIG. 1. It is noted that the arrangement of semiconductor device 200 and through-substrate via 204 is exemplary and is shown in FIG. 2A for purposes of descriptive clarity, and that various different types of semiconductor devices and vias may be used in various implementations.

In semiconductor device 200 of FIG. 2A, a mask layer 230 is shown over a substrate 250. In some implementations, mask layer 230 can be a hard mask layer such that the material for mask layer 230 may comprise a nitride or a nitride-like material, a silicon layer, a silicon oxynitride, an oxide or an oxide-like material such as silicon dioxide, among other materials. In particular implementations, mask layer 230 can be a photoresist layer that has been patterned and developed to form the opening for via 204, as shown. Although mask layer 230 is shown covering substrate 250, in various implementations, additional layers may be present between mask layer 230 and substrate 250. For example, a soft mask layer may be present underneath mask layer 230 and covering substrate 250 in some implementations. The soft mask layer may include dielectric materials, among others, and may not directly contribute to masking during DRIE.

In FIG. 2A, via 204 is shown in cross section as a single opening that can represent various types of cross-sectional shapes that correspond to a shape of the opening in mask layer 230 for via 204. In different implementations, the cross-sectional shape of via 204 can be circular, oval, rectangular, triangular, a general polygonal shape, or an irregular shape.

Substrate 250 may collectively represent various other layers associated with an IC, such as inter level dielectric layers comprising various interconnects, etch stop layers, as well as semiconductor layers formed over an initial substrate that may include a single crystal semiconductor. The initial substrate may comprise bulk silicon, epitaxial silicon over bulk silicon, gallium arsenide, silicon carbide, germanium, silicon on insulator (SOI), or hetero-structures such as gallium nitride on silicon, silicon on sapphire, and the like, and may further include epitaxially grown embedded semiconductor regions such as embedded silicon germanium.

It is further noted that, while an etch path originating above mask layer 230 and penetrating downwards through substrate 250 is shown and described herein, different types of etch paths may be implemented in different implementations. In various implementations discussed herein, TSVs may be formed from a front side or an active side of substrate 250. In some implementations, TSVs can be formed from a back side of substrate 250.

In some implementations, a TSV may be formed using two partial etch paths, each originating at an opposing face of substrate 250, such as by partially etching along the etch path from each side such that the two openings meet in the middle of substrate 250. The use of two partial etch paths may be economical when an etch rate declines substantially over the distance of the etch path, such as for certain high-aspect ratio TSVs. Then, an overall time savings may result by stopping a first partial etch about half-way along the TSV etch path, removing the substrate and restarting the etch process from the opposing face to form a second partial etch that meets the first partial etch in the middle of the substrate. When using two opposing etch paths, the two etch fronts are subject to alignment with each other, which may make such an implementation more feasible for TSV having a larger diameter, for example.

In various implementations, TSVs such as via 204 penetrate substrate 250 to provide interconnections to a second semiconductor substrate that can be bonded with substrate 250. For example, the TSV can be metallized, such as with a copper (Cu) filling that is deposited into via 204 and forms a through substrate conductor trace. The through substrate conductor trace can be extended to contact pads, such as on a surface of substrate 250 that provide a greater area for various forms of external galvanic connections to the contact pads and the through substrate conductor trace.

Figure 2B:
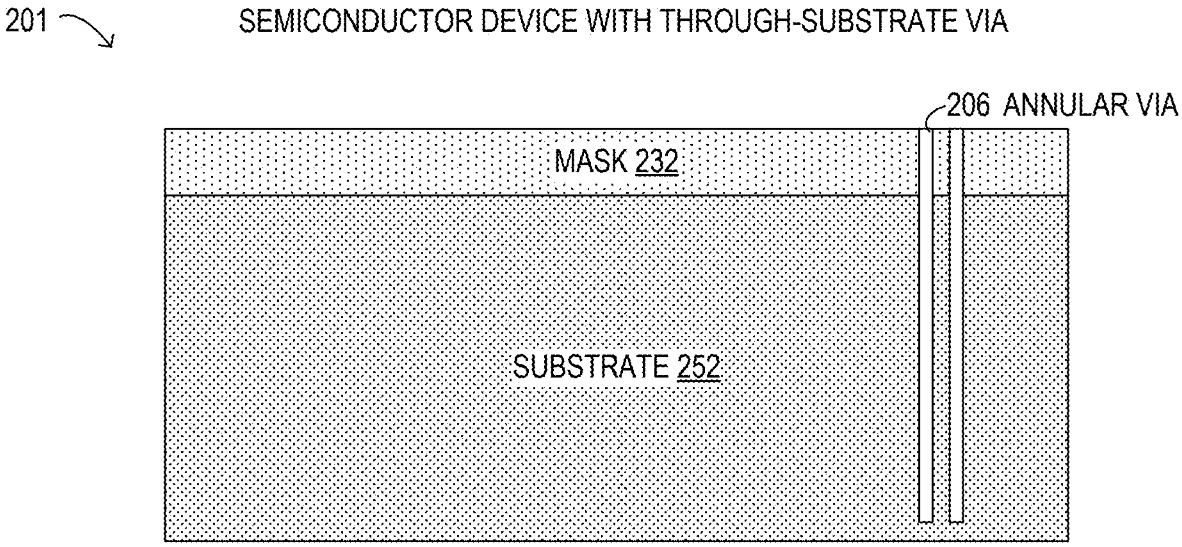
FIG. 2B is a depiction of a semiconductor device with an annular through-substrate via in one implementation.

In FIG. 2B, a depiction of a semiconductor device 201 with an annular via 206 is shown in one implementation. FIG. 2B is a schematic illustration and is not necessarily drawn to scale or perspective. Semiconductor device 201 is similar to semiconductor device 200 shown and described above with respect to FIG. 2A and has a substrate 252 and a mask layer 232 that can be similar to semiconductor device 200. However, instead of a central opening cross-sectional shape as shown and described with respect to FIG. 2A for via 204, semiconductor device 201 in FIG. 2B is shown having annular via 206 that has a cross-sectional shape corresponding to an annulus or a ring that results in an internal core pillar of semiconductor substrate 252 remaining intact as annular via 206 is formed. The annulus or the ring shape of annular via 206 can be circular, oval, rectangular, a general polygonal shape, or an irregular shape, in various implementations.

In various implementations, annular via 206 can be formed as a TSV. For example, the penetration of annular via 206 by DRIE through substrate 252 can be stopped along the etch path prior to complete penetration through substrate 252, as shown in FIG. 2B, such that a core pillar of substrate 252 is preserved. Then, in a subsequent step, annular via 206 can be filled by a metallization step, such as by depositing copper (Cu) to fill annular via 206, which also retains the core pillar. After metallization, annular via 206 is filled with metal and is, therefore, solidified and retains the core pillar. Then, a backside of substrate 252 opposite mask layer 232 can be machined to remove a certain thickness in order to expose the metal filling, such as by griding, milling, mechanical polishing, or chemical-mechanical polishing (CMP), among other removal processes. Once the metal filling of annular via 206 is exposed on the backside of substrate 252 in this manner, additional deposition of metallization layers can be performed to form contact pads or other desired galvanic and/or dielectric structures for connection or isolation of a metal contact trace, such as to prepare the backside (and/or the frontside) surface of substrate 252 for subsequent bonding with another substrate, such as by 3D bonding, wafer-to-wafer (W2W) bonding, die-to-wafer (D2W) bonding, among other techniques.

Figure 3:
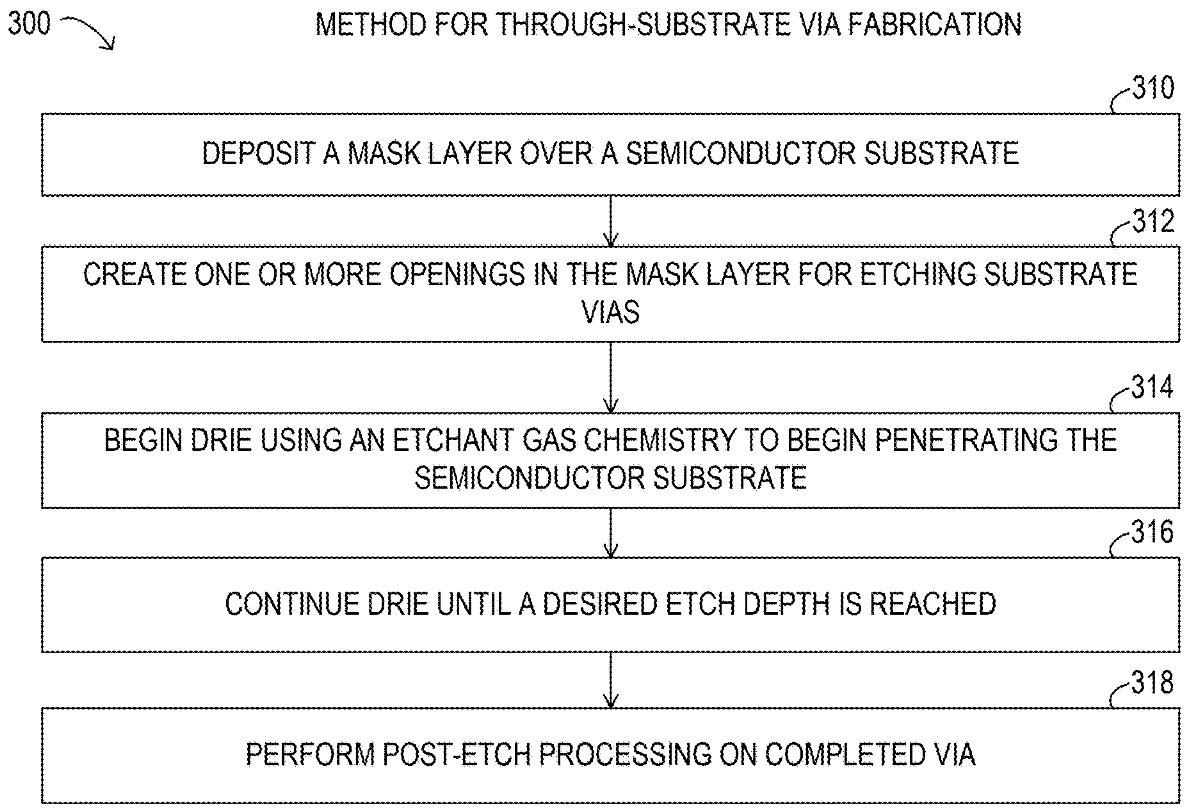
FIG. 3 is a flowchart describing a method for through-substrate via fabrication in one implementation.

Turning now to FIG. 3, a method 300 for through-substrate via fabrication, or simply method 300, is shown in flowchart format. It is noted that some portions of method 300 may be omitted or rearranged in certain implementations. Method 300 may be used to form via 204 and annular via 206, as also described and shown with respect to FIG. 2A and FIG. 2B, respectively, for example.

As shown, method 300 may begin at step 310 by depositing a mask layer over a semiconductor substrate. As noted, the semiconductor substrate may represent various structures, layers, materials used to form a semiconductor device, such as substrate 250 and substrate 252 respectively shown and described above with respect to FIGS. 2A and 2B having mask layers 230 and 232, for example. As noted, the mask layer in step 310 can be a hard mask layer, a photoresist layer, or another kind of mask layer.

At step 312, one or more opening in the mask layer are created for etching substrate vias. The substrate vias can be through substrate vias. In particular implementations of step 312, such as when a photoresist layer was deposited in step 310, the photoresist layer is exposed, and developed over the semiconductor substrate for etching substrate vias. The photoresist layer formed in step 312 in this manner may be used to provide one or more locations for forming respective one or more openings that allow formation of one or more substrate vias at the one or more locations. The one or more openings can correspond in shape to a desired shape of the substrate vias. In some implementations of step 312, such as when a hard mask layer was deposited in step 310, the hard mask layer can be patterned in step 312 to create the one or more openings. For example, a nitride hard mask layer, such as a silicon nitride ($Si_xN_y$), can be patterned to create the one or more openings using a wet etch process, such as with phosphoric acid ($H_3PO_4$) etchant, among other wet etchants. In another example, an oxide hard mask layer, such as silicon dioxide ($SiO_2$), can be patterned to create the one or more openings using a wet etch process, such as with hydrofluoric acid (HF) etchant, among other wet etchants.

At step 314, DRIE begins using an etchant gas chemistry to begin penetrating the semiconductor substrate. DRIE, as described above with respect to FIG. 1, is used as an anisotropic etch process that is able to etch high-aspect ratio holes and vias, typically in a direction normal to the face of a substrate where the mask layer was deposited and the openings in the mask layer were created in step 312. In particular implementations of step 314, a continuous non-Bosch DRIE process is used. At step 316, DRIE is continued until a desired etch depth is reached.

In particular implementations of steps 314 and 316, a continuous non-Bosch etch process is use with a semiconductor substrate comprising silicon (Si), such as a silicon substrate, for example. In the non-Bosch etch process, various halogen gas mixtures can be used for DRIE for the etchant gas chemistry. For example, a first etchant gas chemistry comprising a chlorine-containing gas, the fluorocarbon gas, and the sulfur-containing halogen gas can be used for DRIE. In the first etchant gas chemistry, the chlorine-containing gas can further comprise boron, such as boron trichloride ($BCl_3$). In another example, a second etchant gas chemistry comprising a boron-containing gas, the fluorocarbon gas, and the sulfur-containing halogen gas can be used for DRIE. In the second etchant gas chemistry, the boron-containing gas can further comprise chlorine, such as boron trichloride ($BCl_3$). In a further example, a third etchant gas chemistry comprising boron, chlorine, fluorine, carbon, and sulfur can be used for DRIE. In various implementations, other boron-containing gases can be used for DRIE, such as boron trifluoride ($BF_3$) and boron tribromide ($BBr_3$).

In the example implementations of the DRIE and etchant gas chemistry described in further detail below, the through substrate via formed in steps 314 and 316 corresponds in shape to annular via 206 (see FIG. 2B) and is fabricated to be a TSV, while the semiconductor substrate is a silicon substrate having a photoresist layer for mask layer 232. Under such conditions, and using a continuous non-Bosch DRIE process, such as under the DRIE process conditions given in Table 1, various anomalies and disadvantages of the typical Bosch DRIE process, as noted above, were avoided in observed implementations of forming a TSV that are described in detail below. Specifically, no sidewall scallops were observed in the sidewalls of the TSV and neither was a rough sidewall surface observed. Instead, a smooth sidewall with an acceptably smooth vertical profile, such as suitable for subsequent metallization, was observed, even when a slight tapering and a slight bowing of the etch profile of the TSV sidewall at longer etch depths was present. Furthermore, appreciably high etch rates along the etch path were observed, including etch rates greater than 1 μm/min and up to etch rates greater than 2 μm/min. Additionally, appreciably high levels of mask selectivity were observed that are compatible with longer etch paths and longer etch durations associated with TSV formation, such as mask selectivity greater than 20:1 for the photoresist mask using the non-Bosch DRIE process.

Specifically, using DRIE process conditions and etchant gas chemistry given in Table 1, in which the sulfur-containing halogen gas1 is $SF_6$, the fluorocarbon gas2 is $C_4F_8$, and the inert carrier gas3 is argon (Ar), for a typical continuous non-Bosch process, a rough sidewall and a substantially bowed sidewall profile was observed in the TSV formed, which are undesirable. When the HF power was increased for RF source power 122, the observed sidewall roughness was somewhat decreased, however, the etch rate was also lowered, which is also undesirable.

Then, in a first experimental observation, with the addition of boron trichloride ($BCl_3$) gas to the etchant gas chemistry in Table 1 at a first flow rate of 75 SCCM at a first temperature of 10 C for a first duration of 12 min, an acceptably smooth sidewall of the TSV was observed absent undesirable edge roughness of the sidewall, while no significant bowing of the edge profile of the sidewall was observed. Thus, an acceptably straight sidewall profile with minimal edge roughness was observed, which is desirable. Simultaneously, an increase in the etch rate was observed, resulting in a larger depth for the same first duration, which is also desirable. For example, with the addition of the boron trichloride ($BCl_3$) at the first flow rate, an etch rate increase from 0.55 μm/min to 1.4 μm/min was observed. Still further, an increase in the mask selectivity for the photoresist mask from a selectivity of 13:1 to 26:1 was observed, which is desirable. Similarly, in a second experimental observation, with the addition of chlorine ($Cl_2$) gas to the etchant gas chemistry in Table 1 at the first flow rate at the first temperature, a relatively smooth and relatively unbowed sidewall of the TSV was also observed, while an etch rate increase from 0.55 μm/min to 1.6 μm/min was observed, and an increase in the mask selectivity for the photoresist mask from a selectivity of 13:1 to 24:1 was also observed.

In a third experimental observation, the first flow rate of boron trichloride ($BCl_3$) from the first experimental observation was increased to a second flow rate of 105 SCCM and further increased to a third flow rate of 135 SCCM. As a result, for the second flow rate, the etch rate was decreased to 1.2 μm/min and the mask selectivity was decreased to 18:1, while for the third flow rate, the etch rate was decreased to 1.0 μm/min and the mask selectivity was decreased to 17:1.

In a fourth experimental observation, using a fourth flow rate of 200 SCCM for the fluorocarbon gas2, $C_4F_8$, corresponding to Table 1, and using the first flow rate of boron trichloride ($BCl_3$) from the first experimental observation, which was a decrease in the flow rate for $C_4F_8$ of 50 SCCM, an increase in the etch rate from 1.4 μm/min to 1.7 μm/min was observed, while a decrease in the mask selectivity from 26:1 to 25:1 was observed. Further, using a fifth flow rate of 150 SCCM for $C_4F_8$, an increase in the etch rate from 1.4 μm/min to 2.2 μm/min was observed, while the mask selectivity remained 26:1. In the fourth experimental observation, the same or similar acceptable quality of the edge profile and the edge roughness of the TSV was observed as in the first experimental observation.

In a fifth experimental observation, using a sixth flow rate of 50 SCCM for boron trichloride ($BCl_3$), which was a decrease in the flow rate for $BCl_3$ of 25 SCCM from the first flow rate, a decrease in the etch rate from 1.4 μm/min to 1.3 μm/min was observed, while a decrease in the mask selectivity from 26:1 to 20:1 was observed. Then, using a seventh flow rate of 25 SCCM for boron trichloride ($BCl_3$) a further decrease in the etch rate to 1.2 μm/min was observed from the sixth flow rate, while the mask selectivity remained 20:1.

In a sixth experimental observation, the conditions of the first experimental observation were used, with the exception of replacing octafluorocyclobutane ($C_4F_8$) with hexafluorocyclobutane ($C_4F_6$) at an eighth flow rate of 90 SCCM. The use of hexafluorocyclobutane ($C_4F_6$) can be preferred in some implementations, because $C_4F_6$ has a lower greenhouse warming potential (GWP) than $C_4F_8$. In the sixth experimental observation, an etch rate of 2.4 μm/min was observed, while a mask selectivity of 23:1 was observed, with reasonable sidewall quality, such as with little or no bowing and minimal edge roughness of the TSV sidewall. In some implementations, good sidewall passivation and a suitable etch rate is observed by having a mixture of passivating gases, such as different fluorocarbon gases having varying ratios of fluorine (F) to carbon (C), including various mixtures of octafluorocyclobutane ($C_4F_8$), hexafluorocyclobutane ($C_4F_6$), methyl fluoride ($CH_3F$) and trifluoromethane ($CHF_3$). By using such etch gas mixtures including different fluorocarbon gases, along with boron trichloride ($BCl_3$) (or another boron containing gas) and sulfur hexafluoride ($SF_6$), and in some cases certain hydrocarbon gases, such as methane ($CH_4$) and ethylene ($C_2H_4$), the total gas flow for the etch gas mixture can be reduced, while still achieving acceptable levels of sidewall passivation and etch rate, in various implementations.

Then, in method 300, at step 318, post-etch processing on the completed via is performed. The post etch processing, for example, can include metallization of the via, such as a TSV, for forming specified electrical interconnects, as discussed above, in particular implementations. Other post-processing steps can be used in different implementations.

Figure 4:
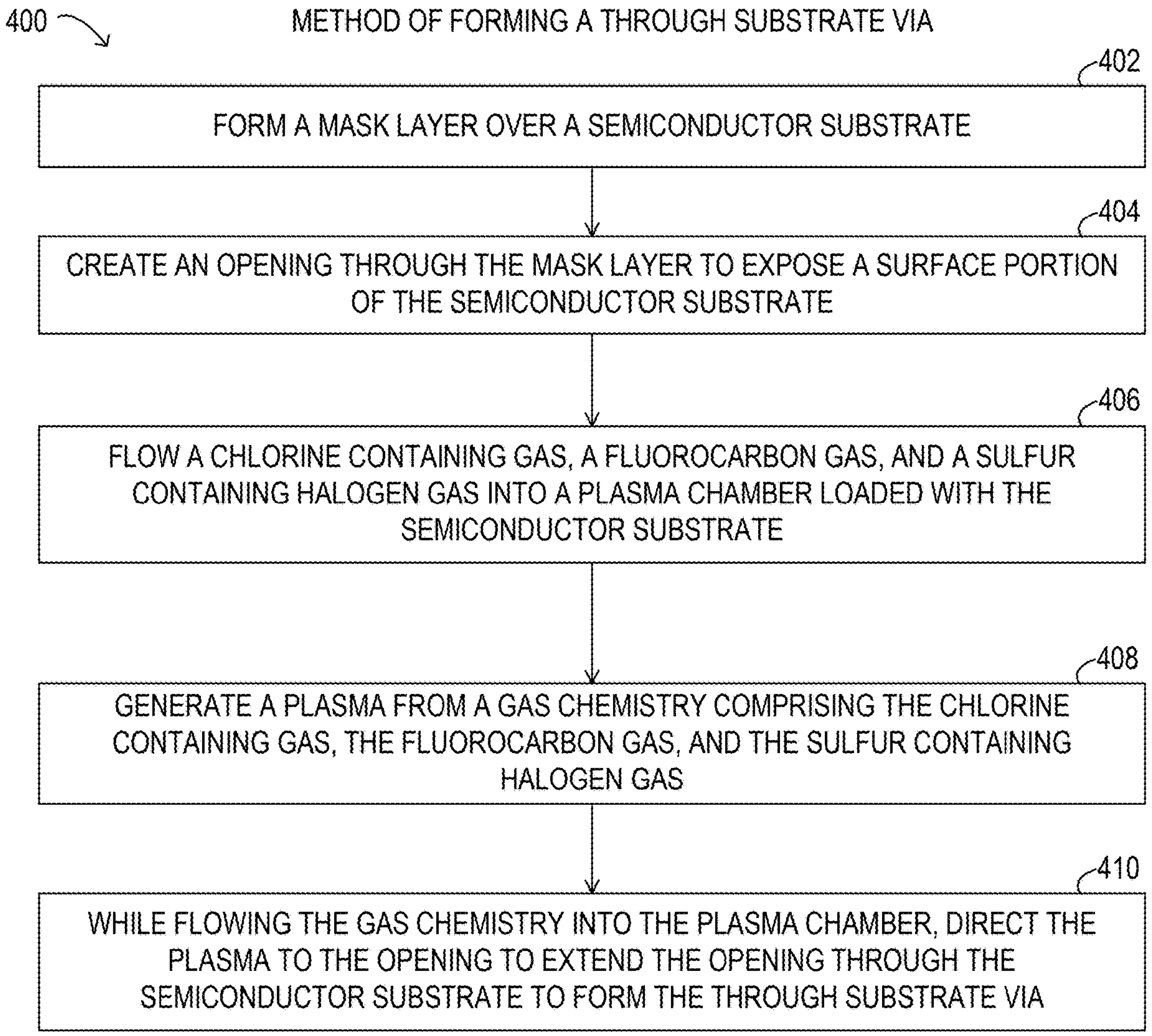
FIG. 4 is a flowchart describing a method for forming a through-substrate via in one implementation.

Turning now to FIG. 4, a method 400 of forming a through substrate via is shown in flowchart format. It is noted that some portions of method 400 may be omitted or rearranged in certain implementations.

Method 400 may begin at step 402 by forming a MASK layer over a semiconductor substrate. At step 404, an opening is created through the mask layer to expose a surface portion of the semiconductor substrate. At step 406, a chlorine containing gas, a fluorocarbon gas, and a sulfur containing halogen gas are flowed into a plasma chamber loaded with the semiconductor substrate. At step 408, a plasma is generated from a gas chemistry comprising the chlorine containing gas, the fluorocarbon gas, and the sulfur containing halogen gas. In particular implementations, the gas chemistry in step 408 may also include at least one of boron trichloride ($BCl_3$), boron trifluoride ($BF_3$), or boron tribromide ($BBr_3$). While flowing the gas chemistry into the plasma chamber, at step 410, the plasma is directed to the opening to extend the opening through the semiconductor substrate to form the through substrate via.

Figure 5:
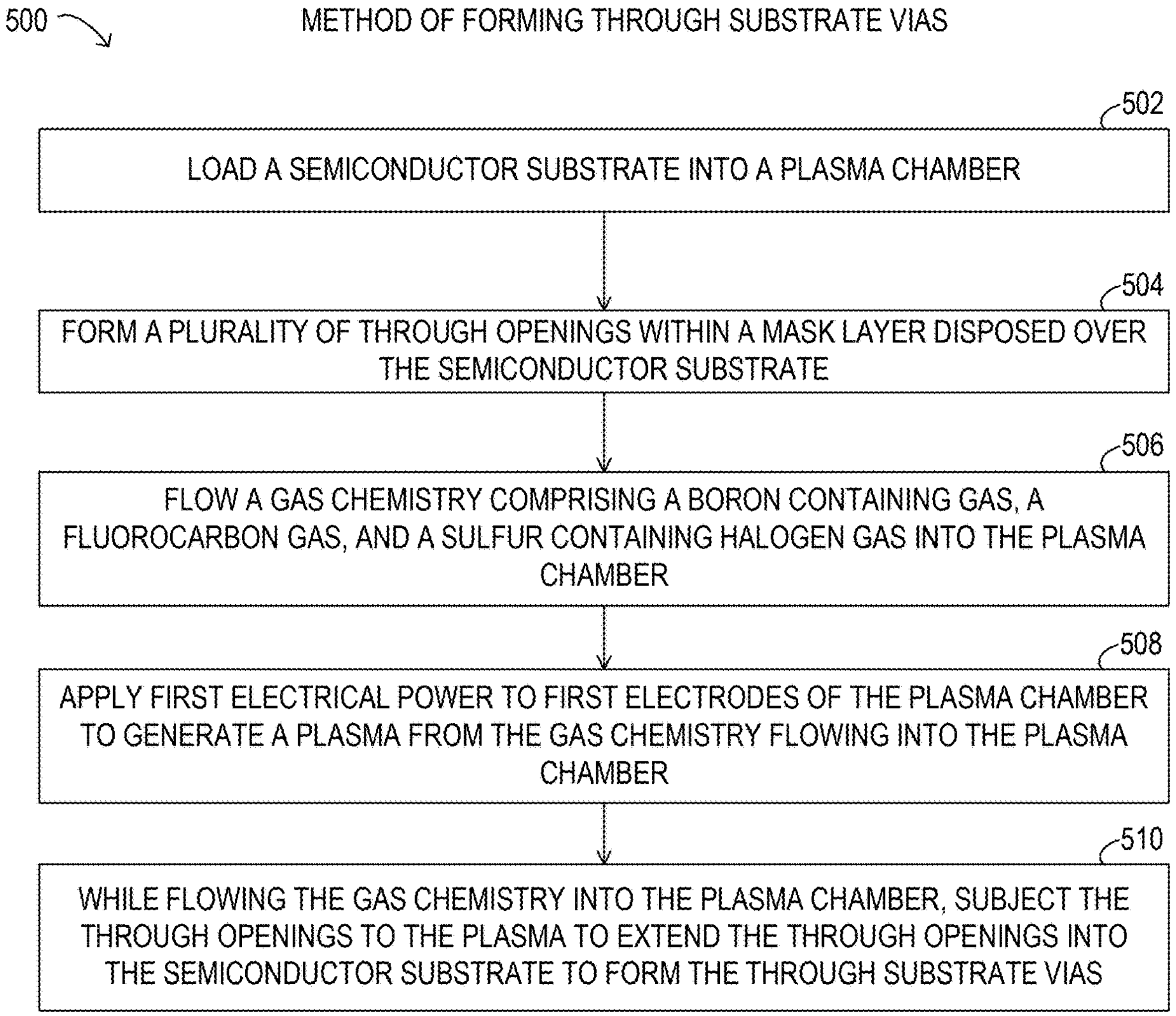
FIG. 5 is a flowchart describing a method for forming through-substrate vias in one implementation.

Turning now to FIG. 5, a method 500 of forming through substrate vias is shown in flowchart format. It is noted that some portions of method 500 may be omitted or rearranged in certain implementations.

Method 500 may begin at step 502 by loading a semiconductor substrate into a plasma chamber. At step 504, a plurality of through openings are formed within a mask layer disposed over the semiconductor substrate. At step 506, a gas chemistry comprising a boron containing gas, a fluorocarbon gas, and a sulfur containing halogen gas is flowed into the plasma chamber. In particular implementations, the boron containing gas can include at least one of boron trichloride ($BCl_3$), boron trifluoride ($BF_3$), or boron tribromide ($BBr_3$). At step 508, first electrical power is applied to first electrodes of the plasma chamber to generate a plasma from the gas chemistry flowing into the plasma chamber. While flowing the gas chemistry into the plasma chamber, at step 510, the through openings are subjected to the plasma to extend the through openings into the semiconductor substrate to form the through substrate vias.

Figure 6:
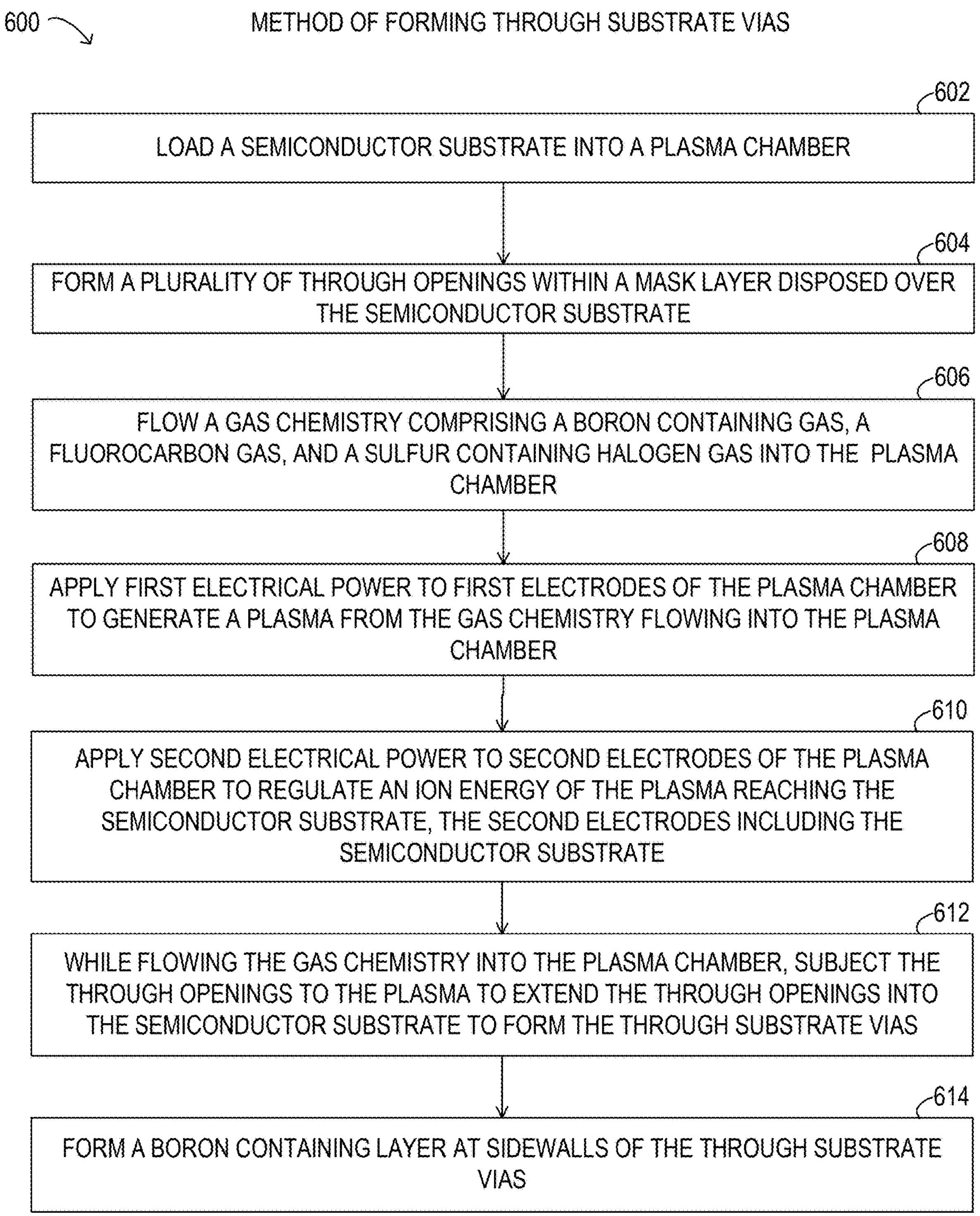
FIG. 6 is a flowchart describing a method for forming through-substrate vias in one implementation.

Turning now to FIG. 6, a method 600 of forming through substrate vias is shown in flowchart format. It is noted that some portions of method 600 may be omitted or rearranged in certain implementations.

Method 600 may begin at step 602 by loading a semiconductor substrate into a plasma chamber. At step 604, a plurality of through openings are formed within a mask layer disposed over the semiconductor substrate. At step 606, a gas chemistry comprising a boron containing gas, a fluorocarbon gas, and a sulfur containing halogen gas is flowed into the plasma chamber. In particular implementations, the boron containing gas can include at least one of boron trichloride ($BCl_3$), boron trifluoride ($BF_3$), or boron tribromide ($BBr_3$). At step 608, first electrical power to is applied to first electrodes of the plasma chamber to generate a plasma from the gas chemistry flowing into the plasma chamber. At step 610, second electrical power is applied to second electrodes of the plasma chamber to regulate an ion energy of the plasma reaching the semiconductor substrate, the second electrodes including the semiconductor substrate. While flowing the gas chemistry into the plasma chamber, at step 612, the through openings are subjected to the plasma to extend the through openings into the semiconductor substrate to form the through substrate vias. At step 614, a boron containing layer is formed at sidewalls of the through substrate vias.

Figure 7:
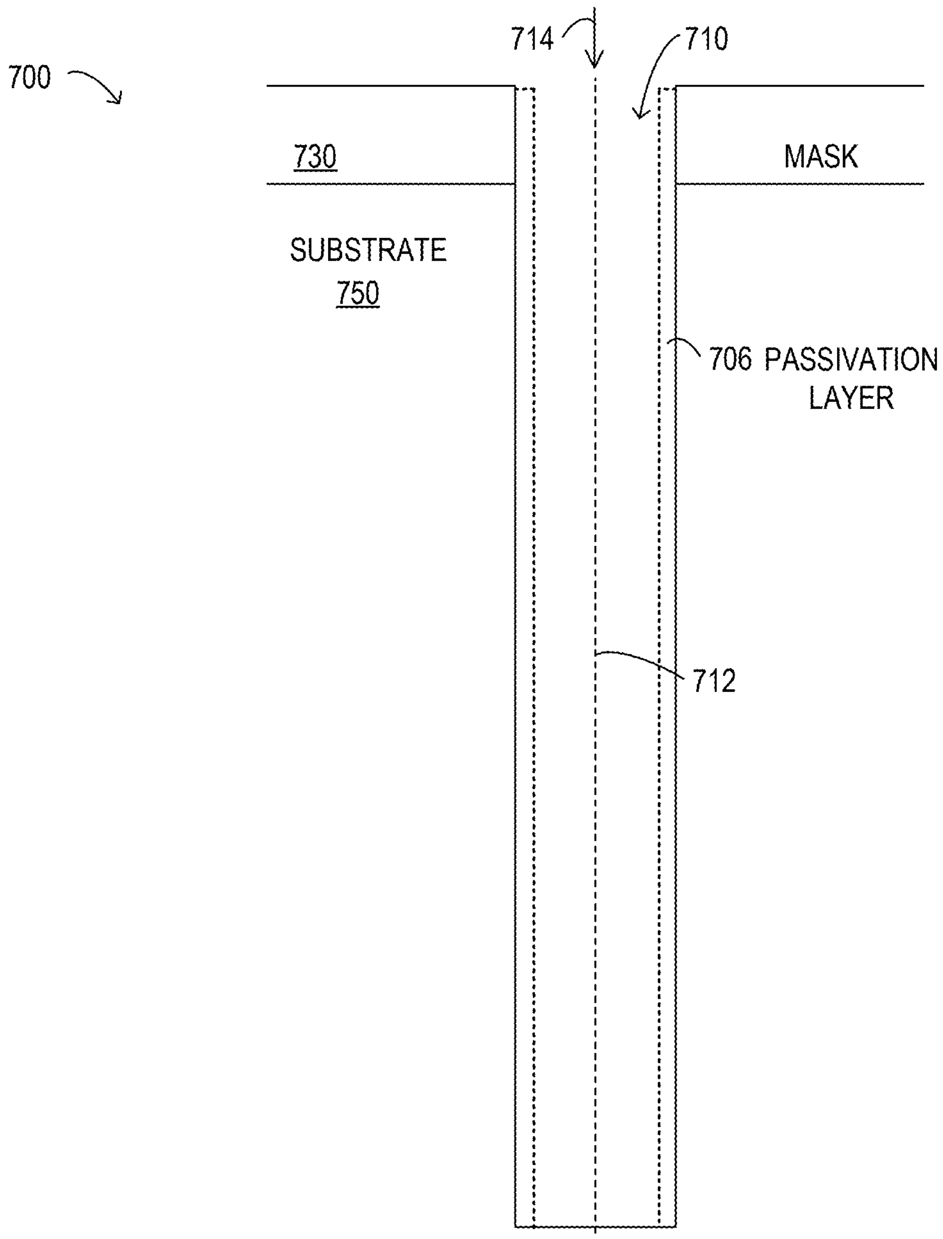
FIG. 7 is a depiction of a passivation layer in a process for through-substrate etching in one implementation.

Referring now to FIG. 7, an etch profile 700, depicted as a cross-sectional schematic illustration, shows a semiconductor substrate 750 during an etch process along an etch path 712 in an etch direction 714, including a depiction of a passivation layer 706 in a process of DRIE, as described herein. Accordingly, in particular implementations of etch profile 700, semiconductor substrate 750 can comprise silicon (Si) and is shown covered by a mask layer 730, which has been patterned to provide an opening 710 for a high aspect ratio structure.

For example, considering the first experimental observation described above with respect to FIG. 3 for the condition of etch profile 700 in FIG. 7, such as when mask layer 730 is a photoresist layer, passivation layer 706 is indicated by observations to be a boron-containing layer, since the boron introduced may aid with sidewall passivation, while the chlorine introduced may aid in increasing the etch rate. For example, boron disulfide ($BS_2$) can form a polymeric structure, such as fluorocarbons $C_xF_y$ are known to form, to provide additional or more robust passivation during DRIE. Accordingly, the use of $SF_6$ is also indicated as contributory to the observed improved performance of passivation layer 706, as a source of sulfur (S) to the DRIE process. For example, the improved performance of passivation layer 706 may result when passivation layer 706 comprises carbon sulfide ($CS_2$), such as with the use of $C_4F_8$ and $SF_6$ in the etch gas mixture, in various implementations.

In other examples of the condition of etch profile 700 in FIG. 7, such as when mask layer 730 is a hard mask layer, such as comprising a nitride or an oxide, different combinations of the etch gas chemistry can be used for DRIE, such as the use of $SF_6$ with oxygen gas ($O_2$), to which a boron-containing and/or a chlorine containing gas may be added. In another implementation when mask layer 730 is a hard mask layer, an etch gas chemistry comprising nitrogen trifluoride ($NF_3$)/$O_2$/hydrogen bromide (HBr) can be used, to which a boron-containing and/or a chlorine containing gas may be added. In particular implementations, the hard mask can be formed in the same chamber or in situ process as DRIE is performed, such as prior to performing DRIE. The hard mask can be patterned and etched to form opening 710. For example, when the hard mask is an oxide, the etch gas chemistry can include $C_x$Fy/Ar, where subscripts x and y can represent different stoichiometric ratios, in different implementations. When the hard mask is a nitride, the etch gas chemistry can include $C_xF_y$+$C_aH_bF_c$/Ar, where subscripts x, y, a, b, and c can represent different stoichiometric ratios, in different implementations.

Example implementations are described below. Other implementations can also be understood from the entirety of the specification as well as the claims filed herein.

Example 1. A method of forming a through substrate via, the method including: forming a mask layer over a semiconductor substrate; creating an opening through the mask layer to expose a surface portion of the semiconductor substrate; flowing a chlorine-containing gas, a fluorocarbon gas, and a sulfur-containing halogen gas into a plasma chamber loaded with the semiconductor substrate; generating a plasma from a gas chemistry including the chlorine-containing gas, the fluorocarbon gas, and the sulfur-containing halogen gas; and while flowing the gas chemistry into the plasma chamber, directing the plasma to the opening to extend the opening through the semiconductor substrate to form the through substrate via.

Example 2. The method example 1, where the fluorocarbon gas includes at least one of: octafluorocyclobutane ($C_4F_8$), methyl fluoride ($CH_3F$), trifluoromethane ($CHF_3$), methane ($CH_4$), ethylene ($C_2H_4$), or hexafluorocyclobutane ($C_4F_6$).

Example 3. The method one of examples 1 or 2, where directing the plasma to the opening further includes: controlling a capacitively coupled power supply between the semiconductor substrate and the plasma chamber to regulate an ion energy of the plasma reaching the opening, including pulsing the capacitively coupled power supply at a pulse frequency with a pulse duty cycle.

Example 4. The method of one of examples 1 to 3, further including: maintaining the semiconductor substrate at a temperature between −20° C. and 30° C. when directing the plasma to the opening, where the surface portion of the semiconductor substrate is exposed to the plasma for a predetermined time duration.

Example 5. The method of one of examples 1 to 4, where the opening and the surface portion are is shaped as an annulus.

Example 6. The method of one of examples 1 to 5, where the chlorine-containing gas includes at least one of boron trichloride ($BCl_3$), boron trifluoride ($BF_3$), or boron tribromide ($BBr_3$), and the method further including: forming a boron-containing layer at sidewalls of the through substrate via.

Example 7. The method of one of examples 1 to 6, where generating the plasma further includes: powering the plasma by applying a radio frequency bias to the gas chemistry flowing into the plasma chamber.

Example 8. The method of one of examples 1 to 7, where the mask layer includes an oxide hard mask or a nitride hard mask.

Example 9. The method of one of examples 1 to 8, where directing the plasma to the opening selectively etches the mask layer with a selectivity ratio of at least 20:1 with respect to the semiconductor substrate.

Example 10. The method of one of examples 1 to 9, where the semiconductor substrate includes silicon, and where directing the plasma to the opening to extend the opening through the semiconductor substrate further includes: etching at a first etch rate of the semiconductor substrate using the gas chemistry that is higher than a second etch rate of the semiconductor substrate using a second gas chemistry absent the chlorine-containing gas.

Example 11. The method of one of examples 1 to 10, where the chlorine-containing gas includes boron trichloride ($BCl_3$), the fluorocarbon gas includes octafluorocyclobutane ($C_4F_8$), and the sulfur-containing halogen gas includes sulfur hexafluoride ($SF_6$).

Example 12. The method of one of examples 1 to 11, where the chlorine-containing gas includes boron.

Example 13. The method of one of examples 1 to 12, where a first flow rate of the chlorine-containing gas is between 25 SCCM and 150 SCCM, a second flow rate of the fluorocarbon gas is between 70 SCCM and 300 SCCM, and a third flow rate of the sulfur-containing halogen gas is between 100 SCCM and 300 SCCM.

Example 14. The method of one of examples 1 to 13, where directing the plasma to the opening includes directing the plasma to the opening for an etch duration between 5 minutes and 70 minutes, the semiconductor substrate being continuously exposed to the plasma generated from the gas chemistry during the etch duration.

Example 15. A method of forming through-substrate vias, the method including: loading a semiconductor substrate into a plasma chamber; forming a plurality of through-openings within a mask layer disposed over the semiconductor substrate; flowing a gas chemistry including a boron-containing gas, a fluorocarbon gas, and a sulfur-containing halogen gas into the plasma chamber; applying first electrical power to first electrodes of the plasma chamber to generate a plasma from the gas chemistry flowing into the plasma chamber; and while flowing the gas chemistry into the plasma chamber, subjecting the through-openings to the plasma to extend the through-openings into the semiconductor substrate to form the through-substrate vias.

Example 16. The method of example 15, further including: applying second electrical power to second electrodes of the plasma chamber to regulate an ion energy of the plasma reaching the semiconductor substrate, the second electrodes including the semiconductor substrate.

Example 17. The method of one of examples 15 or 16, where the boron-containing gas includes chlorine.

Example 18. The method of one of examples 15 to 17, where the boron-containing gas includes boron trichloride ($BCl_3$), and the method further including: forming a boron-containing layer at sidewalls of the through-substrate via.

Example 19. A method of forming through substrate vias, the method including: loading a semiconductor substrate into a plasma chamber, the semiconductor substrate including a through-opening within a mask layer disposed over the semiconductor substrate; and forming, using a plasma process, a through-substrate via within the semiconductor substrate, the through-substrate via including an annulus shape with an inner semiconductor core, the plasma process including exposing the through-opening to a plasma chemistry formed from a gas mixture including boron, chlorine, fluorine, carbon, and sulfur.

Example 20. The method of example 19, where a boron-containing gas in the gas mixture includes at least one of boron trichloride ($BCl_3$), boron trifluoride ($BF_3$), or boron tribromide ($BBr_3$).

As disclosed herein, a semiconductor substrate can be loaded into a plasma chamber, the semiconductor substrate having a through opening within a mask layer disposed over the semiconductor substrate. Using a plasma process, a through substrate via can be formed within the semiconductor substrate. The through substrate via can have a circular shape or an annulus shape with an inner semiconductor core. The plasma process can include exposing the through opening to a plasma chemistry formed from a gas mixture comprising boron, chlorine, fluorine, carbon, and sulfur.

While the disclosure has been described with reference to illustrative implementations, this description is not intended to be construed in a limiting sense. Various modifications and combinations of the illustrative implementations, as well as other implementations, will be apparent to persons skilled in the art upon reference to the description. It is therefore intended that the appended claims encompass any such modifications or implementations.

What is claimed is:

1. A method of forming a through substrate via, the method comprising:
- forming a mask layer over a semiconductor substrate;
- creating an opening through the mask layer to expose a surface portion of the semiconductor substrate;
- continuously flowing a gas chemistry comprising a boron-containing gas, a fluorocarbon gas, and a sulfur-containing halogen gas into a plasma chamber loaded with the semiconductor substrate;
- generating a plasma from the gas chemistry comprising the boron-containing gas, the fluorocarbon gas, and the sulfur-containing halogen gas; and
- while continuously flowing the gas chemistry into the plasma chamber, directing the plasma to the opening to extend the opening through the semiconductor substrate to form the through substrate via.

2. The method of claim 1, wherein the fluorocarbon gas comprises at least one of: octafluorocyclobutane ($C_4F_8$), methyl fluoride ($CH_3F$), trifluoromethane ($CHF_3$), or hexafluorocyclobutane ($C_4F_6$).

3. The method of claim 1, wherein directing the plasma to the opening further comprises:
- controlling a capacitively coupled power supply between the semiconductor substrate and the plasma chamber to regulate an ion energy of the plasma reaching the opening, including pulsing the capacitively coupled power supply at a pulse frequency with a pulse duty cycle.

4. The method of claim 1, further comprising:
- maintaining the semiconductor substrate at a temperature between −20° C. and 30° C. when directing the plasma to the opening, wherein the surface portion of the semiconductor substrate is exposed to the plasma for a predetermined time duration.

5. The method of claim 4, wherein the boron-containing gas comprises at least one of boron trichloride ($BCl_3$), boron trifluoride ($BF_3$), or boron tribromide ($BBr_3$), and the method further comprises:
- forming a boron-containing layer at sidewalls of the through substrate via.

6. The method of claim 1, wherein the opening and the surface portion are shaped as an annulus.

7. The method of claim 1, wherein generating the plasma further comprises:
- powering the plasma by applying a radio frequency bias to the gas chemistry flowing into the plasma chamber.

8. The method of claim 1, wherein the mask layer comprises an oxide hard mask or a nitride hard mask.

9. The method of claim 1, wherein directing the plasma to the opening selectively etches the mask layer with a selectivity ratio of at least 20:1 with respect to the semiconductor substrate.

10. The method of claim 1, wherein the boron-containing gas comprises boron trichloride ($BCl_3$), the fluorocarbon gas comprises octafluorocyclobutane ($C_4F_8$), and the sulfur-containing halogen gas comprises sulfur hexafluoride ($SF_6$).

11. The method of claim 1, wherein a first flow rate of the boron-containing gas is between 25 SCCM and 150 SCCM, a second flow rate of the fluorocarbon gas is between 70 SCCM and 300 SCCM, and a third flow rate of the sulfur-containing halogen gas is between 100 SCCM and 300 SCCM.

12. The method of claim 1, wherein directing the plasma to the opening comprises directing the plasma to the opening for an etch duration between 5 minutes and 70 minutes, the semiconductor substrate being continuously exposed to the plasma generated from the gas chemistry during the etch duration.

13. The method of claim 1, further comprising:

loading the semiconductor substrate into the plasma chamber; and wherein the through substrate via comprises an annular shape with an inner semiconductor core, and wherein the gas chemistry comprises boron, chlorine, fluorine, carbon, and sulfur.

14. The method of claim 13, wherein a boron-containing gas in the continuously-flowed gas mixture comprises at least one of boron trichloride ($BCl_3$), boron trifluoride ($BF_3$), or boron tribromide ($BBr_3$).

15. The method of claim 1, further comprising flowing a hydrocarbon gas comprising at least one of methane ($CH_4$) or ethylene ($C_2H_4$).

16. A method of forming through-substrate vias, the method comprising:

loading a semiconductor substrate into a plasma chamber;

forming a plurality of through-openings within a mask layer disposed over the semiconductor substrate;

continuously flowing a gas chemistry comprising a boron-containing gas, a fluorocarbon gas, and a sulfur-containing halogen gas into the plasma chamber;

applying first electrical power to first electrodes of the plasma chamber to generate a plasma from the gas chemistry continuously flowing into the plasma chamber; and while continuously flowing the gas chemistry into the plasma chamber, subjecting the through-openings to the plasma to extend the through-openings into the semiconductor substrate to form the through-substrate vias.

17. The method of claim 16, further comprising:

applying second electrical power to second electrodes of the plasma chamber to regulate an ion energy of the plasma reaching the semiconductor substrate, the second electrodes including the semiconductor substrate.

18. The method of claim 16, wherein the boron-containing gas comprises chlorine.

19. The method of claim 18, wherein the boron-containing gas comprises boron trichloride ($BCl_3$), and the method further comprising:

forming a boron-containing layer at sidewalls of the through-substrate vias.

20. A method of forming a through substrate via, the method comprising:

forming a mask layer over a semiconductor substrate comprising silicon;

creating an opening through the mask layer to expose a surface portion of the semiconductor substrate;

continuously flowing a gas chemistry comprising a boron-containing gas, a fluorocarbon gas, and a sulfur-containing halogen gas into a plasma chamber loaded with the semiconductor substrate;

generating a plasma from the gas chemistry comprising the boron-containing gas, the fluorocarbon gas, and the sulfur-containing halogen gas; and while continuously flowing the gas chemistry into the plasma chamber, directing the plasma to the opening to extend the opening through the semiconductor substrate to form the through substrate via by etching at a first etch rate of the semiconductor substrate using the gas chemistry that is higher than a second etch rate of the semiconductor substrate using a second gas chemistry absent the boron-containing gas.

* * * * *